United States Patent [19]
Meyer

[11] Patent Number: 5,448,191
[45] Date of Patent: Sep. 5, 1995

[54] FREQUENCY SYNTHESIZER USING NONINTEGER DIVISION AND PHASE SELECTION

[75] Inventor: Jacques Meyer, Corenc, France

[73] Assignee: SGS-Thomson Microelectronics S.A., Gentilly, France

[21] Appl. No.: 298,551

[22] Filed: Aug. 30, 1994

[30] Foreign Application Priority Data

Aug. 31, 1993 [FR] France ............... 93 10577

[51] Int. Cl.[6] .................................... H03B 19/00
[52] U.S. Cl. ..................... 327/105; 327/107; 327/48; 331/2; 331/45; 331/74; 377/48
[58] Field of Search ........... 331/45, 74, 2; 327/105, 327/107; 377/48

[56] References Cited

U.S. PATENT DOCUMENTS

| | | | |
|---|---|---|---|
| 3,928,813 | 12/1975 | Kingsford-Smith | 331/1 A |
| 3,976,945 | 8/1976 | Cox | 327/107 |
| 5,093,632 | 3/1992 | Hietala et al. | 331/1 A |

FOREIGN PATENT DOCUMENTS

| | | |
|---|---|---|
| 2107142 | 4/1983 | United Kingdom . |
| 2228840 | 9/1990 | United Kingdom . |

*Primary Examiner*—Siegfried H. Grimm
*Attorney, Agent, or Firm*—Wolf, Greenfield & Sacks

[57] ABSTRACT

A frequency synthesizer provides a synthesized signal. The synthesizer includes an oscillator that supplies a fast clock signal to a divider programmable by a digital data. The most significant bits of the digital data are provided to the programmable divider, and the least significant bits are provided to an accumulator that cooperates with the programmable divider to increment by one unit its division rank when the accumulator overflows. The synthesizer further includes a generator for generating n increasing delay phases of the synthesized signal; a comparator for comparing the content of the accumulator with n ranges of possible increasing values; and circuits for selecting, as the synthesized signal, the phase whose rank corresponds to the rank of the range within which the content of the accumulator is comprised.

20 Claims, 5 Drawing Sheets

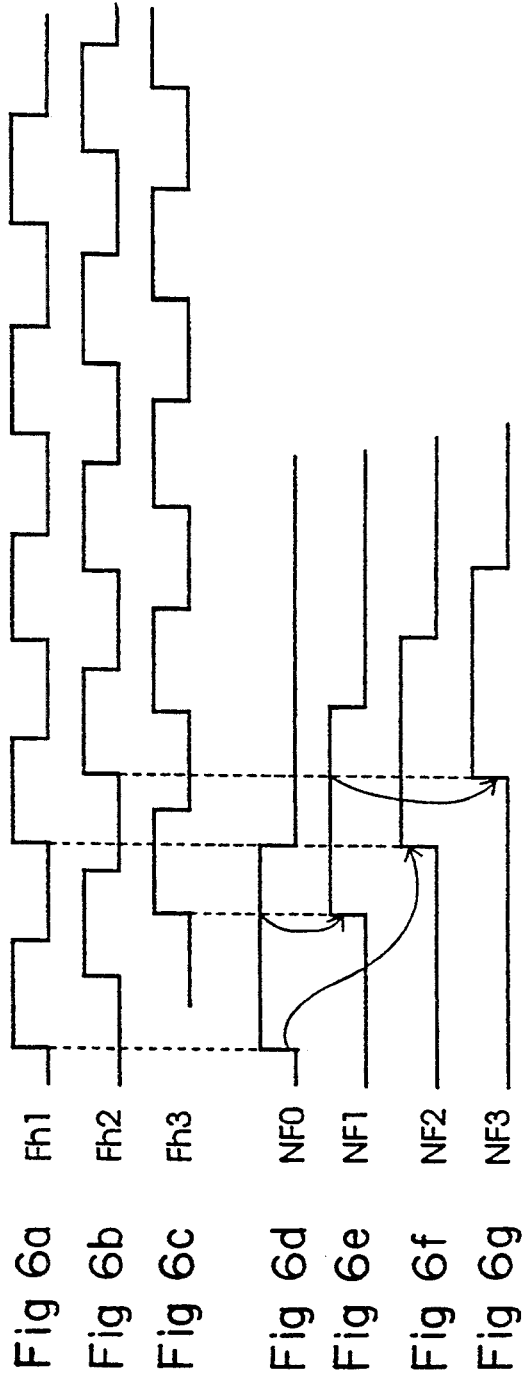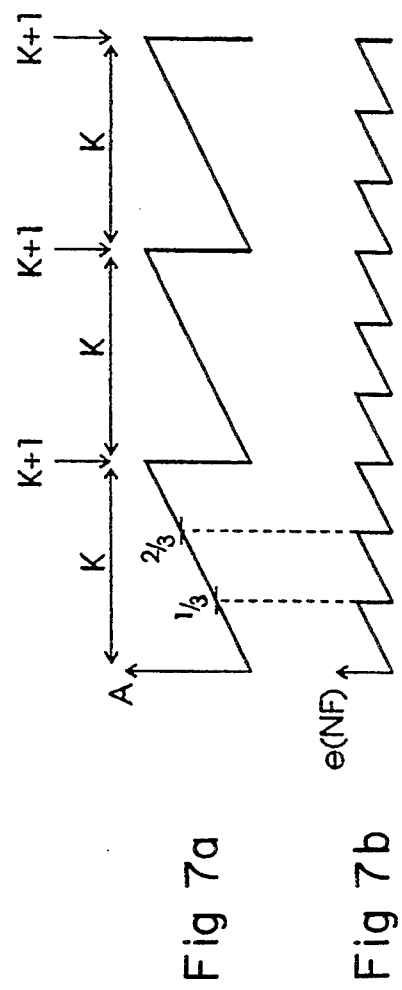

FREQUENCY SYNTHESIZER USING NONINTEGER DIVISION AND PHASE SELECTION

BACKGROUND OF THE INVENTION

1 Field of the Invention

The present invention relates to phase-locked loops (PLLs), and more particularly to a frequency synthesizer serving, in a digital PLL, as a voltage controlled oscillator.

2. Discussion of the Related Art

FIG. 1 schematically represents a conventional PLL architecture. The PLL includes a voltage controlled oscillator (VC0) 10 providing a frequency NF to an N-divider 12. A phase comparator 14 receives the output frequency F from divider 12 and a reference frequency Fref. The phase comparator 14 provides a phase error signal e to a filter 16 whose output c controls the oscillator 10. In steady state, the phase and frequency of signal F are locked on signal Fref. In common applications, for example in the horizontal scanning of a television set, the scanning frequency F is approximately 15 kHz, the frequency NF is approximately 12 MHz (N=768), and filter 16 is a low-pass filter whose cut-off frequency is a few hundred hertz.

At present, the trend is to realize all the PLL elements in the form of digital circuits. This avoids the use of high value capacitors that are difficult to integrate, renders the elements programmable, and simplifies the design operations by allowing use of standard blocks in MOS or CMOS technologies.

FIG. 2 represents an embodiment of a digital VC0 10, when filter 16 is a digital filter and provides a digital correction signal C. The digital equivalent of a controlled oscillator is a frequency synthesizer. To generate signal NF, generally, a clock signal Fh, having a frequency higher than the frequency of signal NF, is divided by a programmable divider 10-1. Divider 10-1 receives as programmation information the digital correction signal C. The higher the frequency Fh is with respect to the synthesized frequency NF, the better the precision or resolution of this synthesized frequency is.

In television horizontal scanning systems, signal NF is approximately 12 MHz. The highest frequency Fh that can be obtained with common technologies is within the range of 100 to 300 MHz. The frequency Fh must be particularly steady. One of the methods to obtain a high steady frequency is to use a frequency multiplier that, in fact, is an auxiliary analog PLL. The analog PLL includes a controlled oscillator 10-2 providing the frequency Fh to the programmable divider 10-1 and to a divider 10-3. A phase comparator 10-4 receives the output of divider 10-3 and the output of a quartz oscillator 10-5. The output e2 of comparator 10-4 is provided to a filter 10-6 that in turn provides a correction signal c2 to the controlled oscillator 10-2.

The above-described frequency multiplier PLL operates at a particularly high frequency. Accordingly, the capacitors required for the construction of the PLL, more particularly the capacitors of filter 10-6, are small-size and integrable capacitors. The clock frequency Fh is equal to the frequency of oscillator 10-5 multiplied by the dividing ratio of divider 10-3. The oscillator 10-5 is not entirely integrable but it is generally not necessary. In fact, the signal of this oscillator may be an arbitrary clock signal that is very frequently available in integrated circuits including the digital PLL. The required frequency Fh is obtained by suitably selecting the dividing ratio of divider 10-3.

If it is desired to obtain a frequency NF having a good resolution, the dividing ratio K of divider 10-1 must be high, or alternatively, the frequency Fh must be much higher than frequency NF. However, the frequency Fh is in practice limited to a few hundred MHz. With a frequency Fh of 220 MHz, for example, the dividing ratio is small, within 18 and 19, to obtain a signal NF of approximately 12 MHz in a television horizontal scanning PLL.

FIG. 3 represents a conventional digital frequency synthesizer for dividing a high frequency Fh by a noninteger number. The programmation data C is partitioned into an integer portion Int(C)=K, corresponding, for example, to a few high weight bits of data C, and into a fractional portion Frac(C) corresponding to the remaining low weight bits of data C. The integer portion K is provided to a first input of an adder 20. Adder 20 provides to a conventional programmable divider 22 the sum of the integer portion K and of a carry bit Cout that is provided by a second adder 24. The carry bit Cout is provided either to a second input of adder 20 or to a carry input of adder 20, the second input of adder 20 then receiving value 0. The divider 22 provides the signal NF to be synthesized by dividing the high frequency Fh by K (or by a ratio corresponding to K).

The fractional portion Frac(C) of data C is provided to a first input of adder 24. A register 25 receives the output of adder 24, and the content A of register 25 is provided to a second input of adder 24. The register 25 is enabled at the rate of signal NF. The adder 24 and register 25 constitute a so-called "accumulator" designated by reference numeral 26.

Initially, the accumulator 26 (i.e. the content A of register 25) is at "0". The register 25 receives at the rate of signal NF the sum of its content A and of the fractional portion Frac(C). The accumulator 26 is designed so that it can overflow when the sum of the successive fractional portions reaches a value corresponding to one unit of the dividing ratio K. At the moment when the accumulator overflows, the value K provided to the programmable divider is incremented by 1 only during one cycle of signal NF.

With this configuration, the high frequency Fh is sometimes divided by K, sometimes divided by K+1, the ratio between the number of times frequency Fh is divided by K+1 and the number of times it is divided by K being equal to the fractional portion of data C. Thus, the average frequency of the synthesized signal NF is equal to the frequency Fh divided by the desired fractional number.

The use of the synthesizer of FIG. 3 in a digital PLL provides a good precision for the frequency of the signal F generated by the PLL, since, to obtain the signal F, the signal NF and its frequency error are divided by a high number (approximately 768 in the example of horizontal scanning of a television set) by divider 12.

However, the frequency F generated by the PLL exhibits a jitter equal to the period of the high frequency Fh. In some applications, as for example in the horizontal scanning of a television set, this jitter cannot be seen on the screen with a maximum 220-MHz frequency Fh. In contrast, if the PLL is used in monitors having a high scanning frequency, the jitter becomes visible.

SUMMARY OF THE INVENTION

Thus, an object of the present invention is to provide a frequency synthesizer to be used in a digital PLL which has a particularly slight jitter of the signal generated by the PLL.

To achieve this object, the present invention uses a synthesizer including an accumulator such as the one of FIG. 3. From the clock frequency Fh, n signals are generated at the frequency of signal NF to be synthesized, referred to as phases of signal NF. A phase is delayed with respect to the preceding one by approximately the duration of the period of the clock signal Fh divided by n. A comparator including n windows receives the content A from the accumulator and selects, as the output signal NF, the phase whose rank corresponds to the rank of the window including the content of the accumulator.

The present invention more particularly provides a frequency synthesizer providing a synthesized signal, including an oscillator that supplies a fast clock signal to a divider programmable by a digital data, the most significant bits of the digital data being provided to the programmable divider, and the least significant bits being provided to an accumulator cooperating with the programmable divider to increment by one unit its division rank when the accumulator overflows. The synthesizer includes a generator for generating n phases of the synthesized signal having increasing delays; means for comparing the content of the accumulator with n ranges of possible increasing values; and means for selecting, as the synthesized signal, the phase whose rank corresponds to the rank of the range within which the content of the accumulator is comprised.

According to an embodiment of the invention, the synthesizer includes an oscillator providing an odd number n of clock phases having the same frequency and delayed with respect to the preceding one by one n-th of the clock period, the phases of the synthesized signal being obtained from respective clock phases.

According to an embodiment of the invention, one of the clock phases is provided to the programmable divider so that the programmable divider provides an initial phase of the synthesized signal, the other phases of the synthesized signal being obtained by synchronizing the initial phase of the synthesized signal with the remaining clock phases, respectively; one phase of the synthesized signal is selected as the synthesized signal through a multiplexer controlled by said comparison means.

According to an embodiment of the invention, the phases of the synthesized signal are obtained through flip-flops that are connected in series after the programmable divider and are enabled in interleaved mode by the clock phases.

According to an embodiment of the invention, the flip-flops are connected so that a flip-flop of rank i is enabled by the clock phase of rank $n+2-i$ (modulo n), and provides the phase of rank $n-i$ (modulo n) of the synthesized signal through a delay circuit of $n-i-1$ clock cycles.

The foregoing and other objects, features, aspects and advantages of the invention will become apparent from the following detailed description of the present invention when taken in conjunction with the accompanying drawings.

BRIEF DESCRIPTION OF DRAWINGS

FIG. 6(a-g) represents the waveforms of various signals used in the frequency synthesizer of FIG. 4;

FIG. 7(a-l) represents phase error variations obtained by using a synthesizer according to the invention in a PLL.

DETAILED DESCRIPTION

Figure 1:
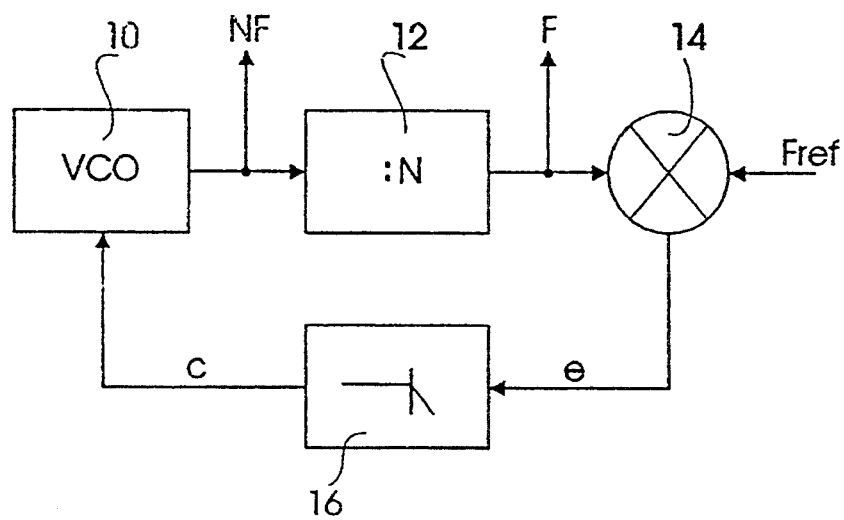
FIG. 1, described above, schematically represents a conventional phase-locked loop (PLL)
Figure 2:
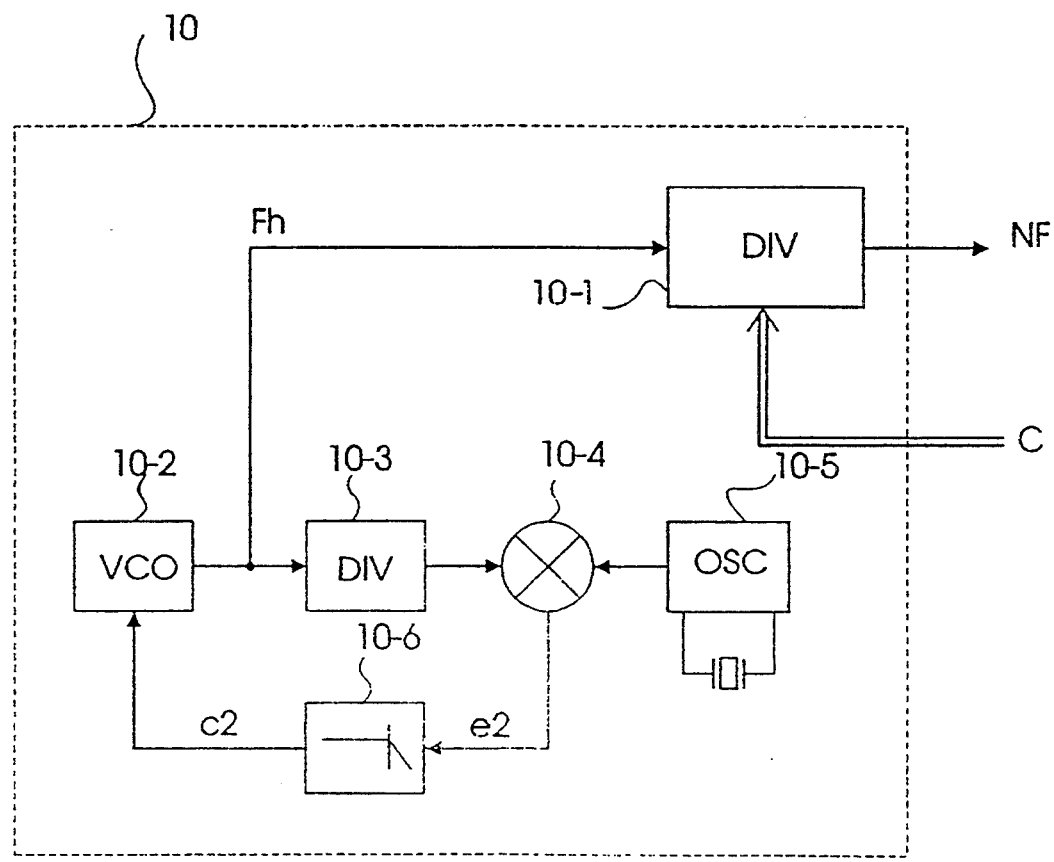
FIG. 2 represents an embodiment of a frequency synthesizer corresponding to a digital implementation of the controlled oscillator of the PLL of FIG. 1.
Figure 3:
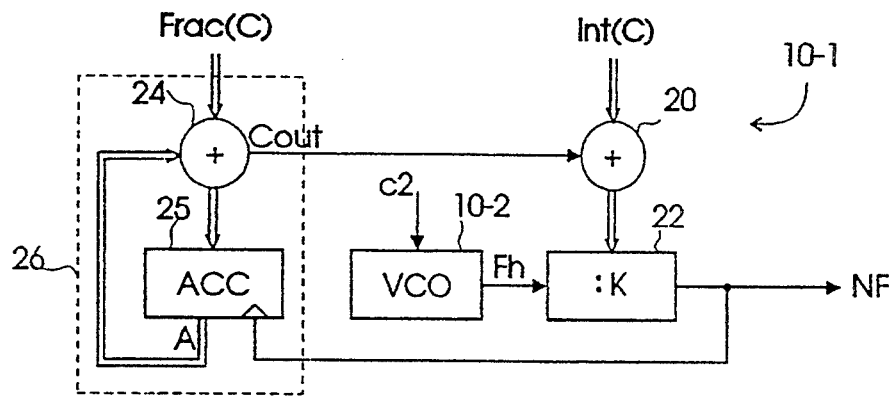
FIG. 3 represents an embodiment of a frequency synthesizer for performing a division by a fractional number.
Figure 4:
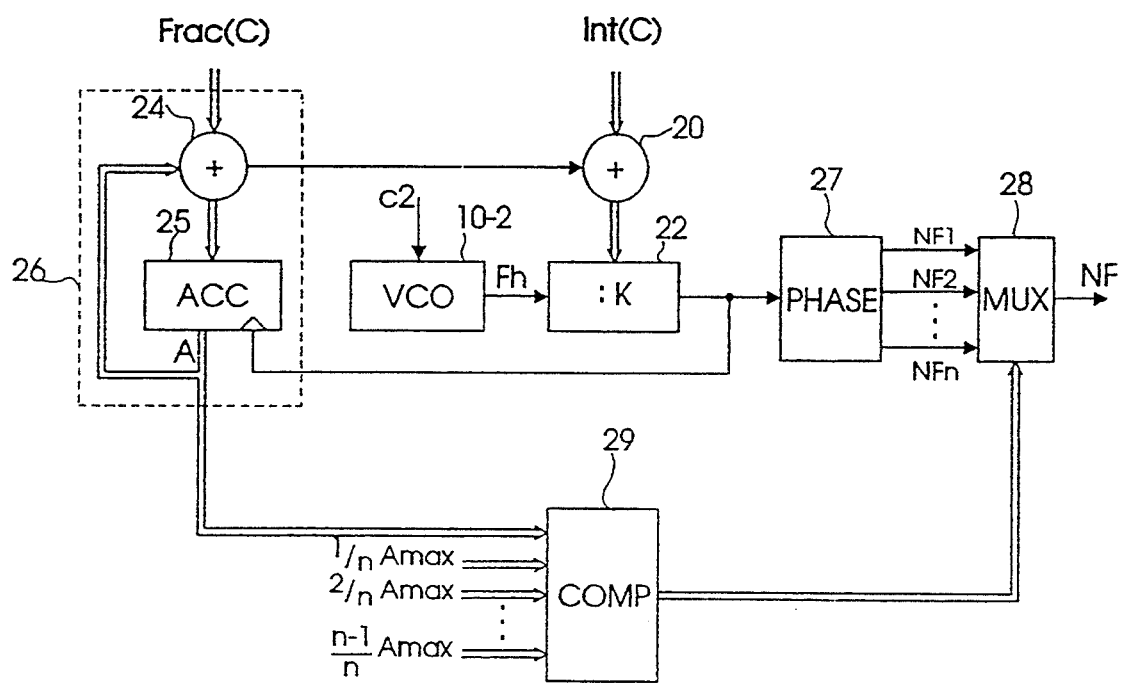
FIG. 4 represents a general embodiment of a frequency synthesizer according to the invention.

In FIG. 4, a frequency synthesizer according to the invention basically comprises an accumulation synthesizer such as the one of FIG. 3. The clock frequency Fh to be provided to the synthesizer is generated by an auxiliary PLL such as the one of FIG. 2. In the drawings, same references designate same elements.

According to the invention, a phase generator 27 receives the output of divider 22. Generator 27 provides n signals NF1, NF2 ... NFn to a multiplexer 28. Signals NF1-NFn are at the frequency of signal NF to be synthesized but delayed with respect to the preceding one by one n-th of the period of clock signal Fh. The generator 27 provides n phases of signal NF. Those skilled in the art can obtain these phases in various ways, for example by delaying one phase with respect to the preceding one with delay circuits. An example is described in detail hereinafter.

The content A of accumulator 26, which in fact indicates the phase error of signal NF that is synthesized with respect to the desired signal NF, is used by an n-window comparator 29 to select, from among the phases, the phase whose active edge (for example the rising edge) is the closest to the desired rising edge of signal NF. Comparator 29 receives the content A of accumulator 26 and the values Amax/n, 2Amax/n ... $(n-1)$Amax/n defining the intermediate limits of the n windows (Amax designates the maximum content of the accumulator). When value A is comprised within a window of rank i (delineated by values $(i-1)$Amax/n and iAmax/n), the multiplexer 28 is controlled to select the phase NFi.

With this configuration, the jitter of signal F generated by a PLL incorporating the synthesizer is divided by n.

Figure 5:
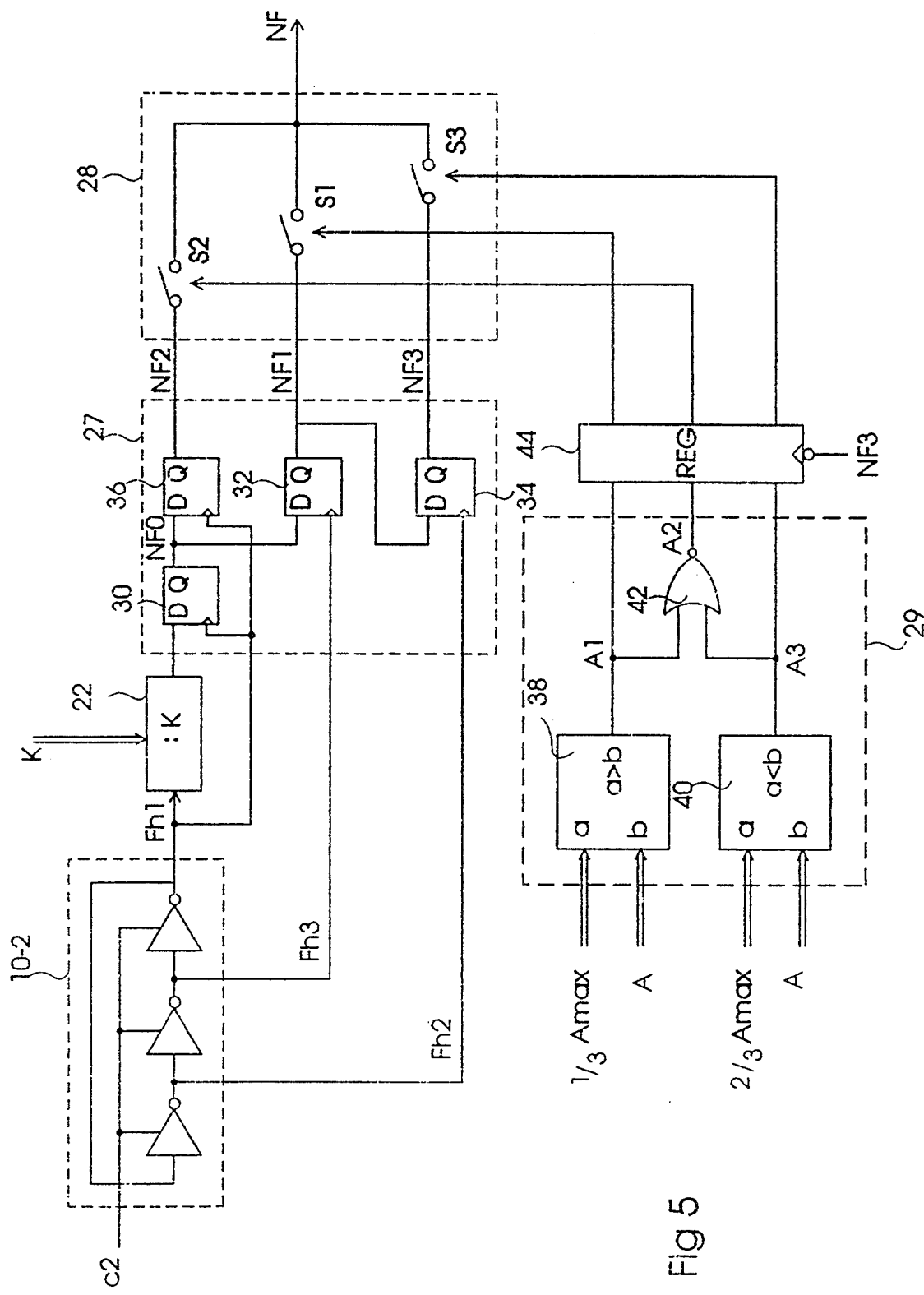
FIG. 5 represents a specific embodiment of a frequency synthesizer according to the invention.

FIG. 5 represents a specific embodiment of the frequency synthesizer according to the invention. The description of FIG. 5 will be better understood by referring also to FIG. 6 that represents the waveforms of the various phases of the signals that are used according to the invention.

In FIG. 5, a controlled oscillator 10-2, providing n=3 clock signals (Fh1, Fh2, Fh3) at the clock frequency Fh, is used. A clock signal, referred to as a clock phase, is delayed with respect to the preceding one by one third of the clock period. The controlled oscillator 10-2 is, for example, a ring oscillator including three inverters whose power supply current is set by the abovementioned control signal c2. At the outputs of these inverters, the respective clock phases Fh1, Fh2 and Fh3 are drawn. Phase Fh1 is provided to the divider 22 of the synthesizer of FIG. 3. It is desired to obtain phases NF1, NF2 and NF3 of the signal NF to be synthesized, phases NF2 and NF3 being delayed with respect to phase NF1 by one third and two thirds, respectively, of the period of the clock signal Fh.

In the specific embodiment that is represented, the output of divider 22 is synchronized with phase Fh1 through a flip-flop 30 to obtain an intermediate phase NF0 of signal NF. The phase NF0 is synchronized with phase Fh3 through a flip-flop 32 to obtain the phase NF1. The phase NF1 is synchronized with phase Fh2 through a flip-flop 34 to obtain the phase NF3. The phase NF2 is obtained by delaying phase NF0 by one period of the phase Fh1 through a flip-flop 36.

A multiplexer 28 formed by switches S1–S3 provides, as a synthesized signal NF, a suitable phase among phases NF1–NF3. Switches S1–S3 are controlled by a window comparator 29 described hereinafter.

A first simple comparator 38 receives at an input a one third of the maximum value Amax that can be contained in the accumulator 26. A input b receives the content A of the accumulator. The switch S1 is controlled by the output A1 of comparator 38; output A1 is active when the content A of accumulator 26 is smaller than one third of the maximum value.

A second simple comparator 40 receives at an input a two thirds of the maximum value Amax, and at an input b the content A of accumulator 26. The switch S3 is controlled by the output A3 of comparator 40; output A3 is active when the content A of the accumulator is higher than two thirds of the maximum value. The switch S2 is controlled by the output A2 of a NOR gate 42 receiving signals A1 and A3. The signal A2 is active when signals A1 and A3 are both inactive, which is the case when the content A of accumulator 26 is between one third and two thirds of the maximum value Amax. Elements 38–42 constitute a comparator with three windows having the same width.

A register 44, enabled by the complement of the last phase (NF3) of signal NF, transmits the states A1–A3 to switches S1–S3 after the falling edge of phase NF3, when phases NF1–NF3 are all at "0". This avoids any problem associated with the rapidity of switching. Switching can occur at any time, within a large range of time comprised between the falling edge of phase NF3 and the next rising edge of phase NF1. If switches S1–S3 could switch before the falling edge of phase NF3, signal NF would risk going through a zero crossing between the switching time and the occurrence of the rising edge of the new selected phase NF2 or NF3. If switching must be delayed by a given number of cycles of the synthesized signal NF, signals A1–A3 will be correspondingly delayed by the flip-flops that are enabled by signal NF.

FIG. 7 represents the variation of the content A of accumulator 26, and the corresponding variation, obtained with the synthesizer of FIG. 4, of the phase error e(NF) of the synthesized signal NF. Initially, in steady state, the register 25 is at "0" and the division rank of divider 22 is K. The phase selected for signal NF is then NF1. At each cycle of signal NF, the content A of register 25 is increased, which corresponds to the fact that the phase error e(NF) (phase advance) between the synthesized signal NF and the desired signal NF increases. Indeed, the desired dividing ratio is comprised within K and K+1 whereas the dividing ratio that is used in the present case is K.

When the content A of register 25 reaches one third of its maximum value, the next phase NF2 is selected as a signal NF. At the very moment of this switching, the phase error e(NF) is compensated for, but increases again.

When the content A of register 25 reaches two thirds of its maximum value, the phase NF3 is selected as a signal NF. At the very moment of switching, the phase error e(NF) is again compensated for but starts again to increase. The phase error e(NF) increases until the moment when the register 25 overflows and when the dividing ratio of divider 22 becomes K+1 during one cycle of signal NF. Then, the phase NF1 is again selected and the cycle is resumed when the dividing ratio of divider 22 is again K.

Thus, the synthesizer of FIG. 5 adjusts the phase of the synthesized signal NF with the desired phase by the same number of successive steps as the number of clock phases provided by the oscillator 10-2, which divides the phase error by the number of clock phases 10-2. Hence, the jitter of signal F, generated by a PLL incorporating a synthesizer according to the invention, is divided by the number of clock phases.

In FIG. 5, flip-flops 30–34 are connected in series but are enabled in an "interleaved" mode, that is, for example, the flip-flop enabled by the clock phase Fh3 receives the output of the flip-flop enabled by the phase Fh1 (instead of phase Fh2). The flip-flops are thus connected so that the enabling of a flip-flop occurs two thirds of a clock period Fh after the enabling of the preceding flip-flop. If the flip-flops were connected in a non-interleaved way, a current flip-flop would be enabled only one third of a period after the preceding flip-flop and it is highly possible that, due to the high frequency of operation, at the moment when the current flip-flop is enabled, the output of the preceding flip-flop had no time to reach its final value yet. Of course, the flip-flops are connected in a non-interleaved mode if the operation frequency is sufficiently low to allow it.

Flip-flops 30–36 can be eliminated if a programmable divider 22 is used for each phase Fh1–Fh3. However, such an approach would occupy a large silicon surface.

Figure 8:
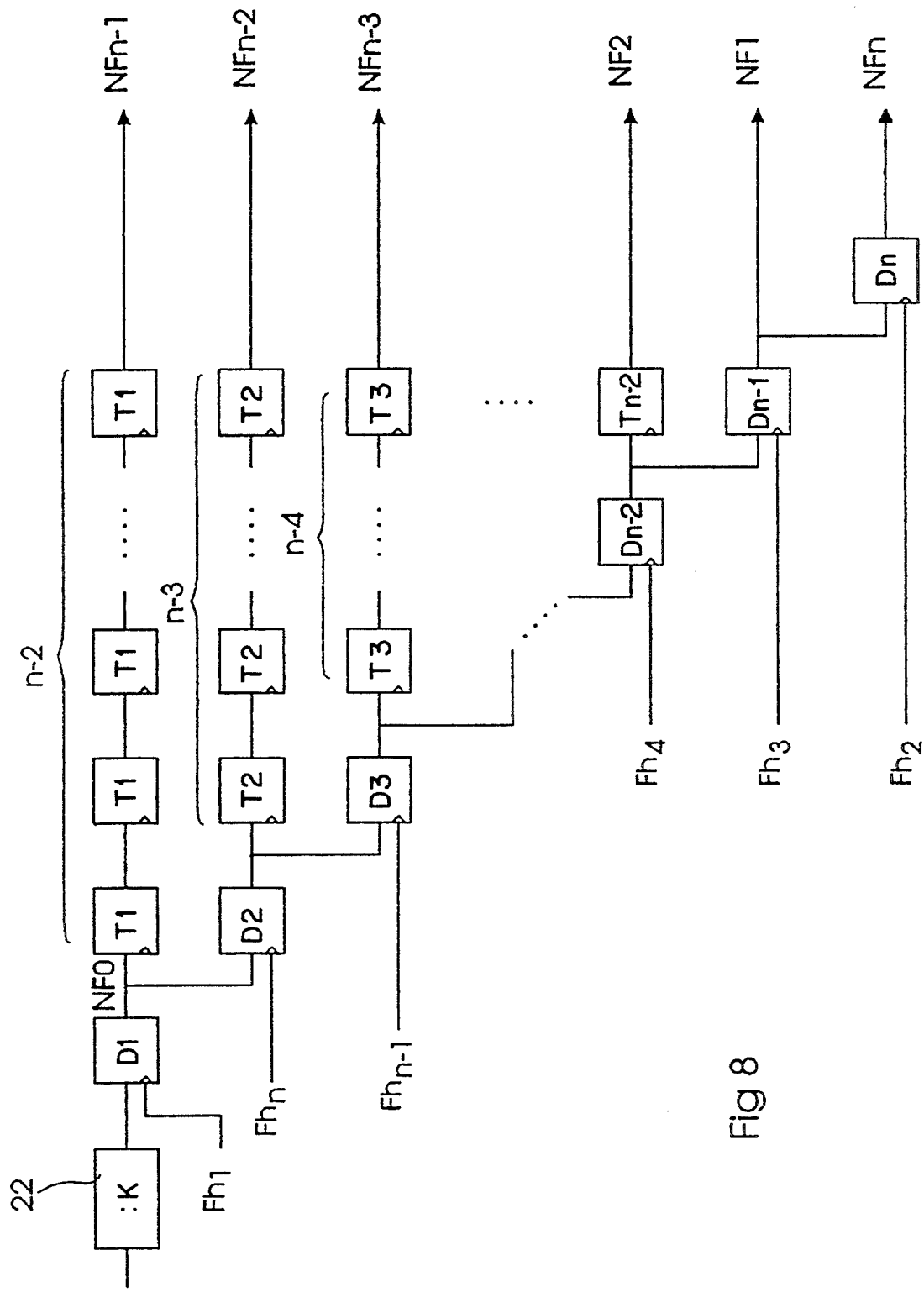
FIG. 8 illustrates an interleaved configuration of flip-flops to obtain n signals intended to form the output signal of the frequency synthesizer.

FIG. 8 illustrates an interleaved flip-flop configuration to obtain n phases NF1–NFn of the synthesized signal from n clock phases Fh1–Fhn of increasing phaseshifts. At the output of divider 22, n flip-flops D1–Dn are disposed in series.

The flip-flop D1 receives the output of divider 22 and provides the phase NFn−1 of the synthesized signal delayed by n−2 clock cycles by n−2 flip-flops T1. Flip-flops D1 and T1 are enabled by the clock phase Fh1.

A flip-flop Di receives the output of flip-flop Di−1 and is enabled by the clock phase $Fh_{n+2-i}$. The output of flip-flop Di is delayed by n−i−1 clock cycles by n−i−1 flip-flops Ti before providing the phase NFn−i of the synthesized signal. Flip-flops Ti are enabled by the clock phase $Fh_{n+2-i}$. No delay is provided for flip-flops Dn−1 and Dn (n−i−1≦0). Values n+2−i and n−i are comprised between 1 and n (they are defined modulo n).

With this configuration, a flip-flop is enabled 1−1/n clock period after the preceding clock period, which leaves enough time for switching of the flip-flops, even if number n is significant.

Of course, those skilled in the art will be able to devise various interleaved connections which, however, may be less advantageous.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A frequency synthesizer providing a synthesized signal, comprising:
    an oscillator supplying a fast clock signal,
    a programmable divider dividing the fast clock signal by the value of the most significant bits of digital control data to produce an output clock signal;
    an accumulator receiving and accumulating the least significant bits of the digital control data and outputting an overflow to the programmable divider so that its division rank is increased by one;
    a generator for generating n phase signals of the output clock signal each having increased delays;
    means for comparing the content of the accumulator with n ranges of possible increasing values and outputting a rank of the range within which the content of the accumulator is comprised; and
    means for selecting, as the synthesized signal, the phase signal whose rank corresponds to the rank outputted by the comparing means.

2. The synthesizer of claim 1, wherein said oscillator provides an odd number n of clock phases having the same frequency and delayed with respect to the preceding one by one n-th of the clock period, the phase signals being obtained from respective clock phases.

3. The synthesizer of claim 2, wherein one of the clock phases is the fast clock signal and the programmable divider provides an initial phase signal,
    wherein the other phase signals are obtained by synchronizing the initial phase signal with the remaining clock phases, respectively, and
    wherein said means for selecting includes a multiplexer controlled by said comparing means.

4. The synthesizer of claim 3, wherein the phase signals are obtained through flip-flops connected in series after the programmable divider and enabled in interleaved mode by the clock phases.

5. The synthesizer of claim 4, wherein said flip.-flops are connected so that a flip-flop of rank i is enabled by the clock phase of rank $n+2-i$, and provides the phase signal of rank $n-i$ through a delay circuit; of $n-i-1$ clock cycles.

6. A frequency synthesizer for dividing a clock signal by a noninteger value comprising:
    an accumulator for accumulating a fractional portion of said noninteger value, and for outputting an overflow when the accumulated fractional portion exceeds a maximum value;
    a programmable divider for dividing said clock signal by an integer portion of said noninteger value incremented by said overflow;
    a generator for generating a plurality of phase signals corresponding to said divided clock signal each having a different phase; and
    a selector for selecting one of said phase signals as a synthesized signal in response to the value of said accumulator.

7. The frequency synthesizer of claim 6, wherein said generator generates n phase signals, each being delayed from the preceding one by one n-th of the period of said divided clock signal.

8. The frequency synthesizer of claim 6, wherein said selector includes:
    a comparator for comparing the value of the accumulator with a set of possible ranges, and
    a multiplexer controlled by said comparator for selecting one of said phase signals based upon the range to which said accumulator value corresponds.

9. The frequency synthesizer of claim 8, wherein said comparator includes
    a plurality of simple comparators for comparing said accumulator value with multiple subdivisions of a maximum accumulator value; and
    a plurality of gates connected to said simple comparators for outputting a rank corresponding to the range to which said accumulator value corresponds.

10. A method for dividing a clock signal by a noninteger value comprising the steps of:
    accumulating a fractional portion of said noninteger value;
    outputting an overflow when the accumulated fractional portion exceeds a maximum value;
    dividing said clock signal by an integer portion of said noninteger value incremented by said overflow;
    generating a plurality of phase signals corresponding to said divided clock signal each having a different phase;
    selecting one of said phase signals as a synthesized signal based upon said accumulated fractional portion.

11. The method of claim 10, wherein said selecting step includes generating n phase signals, each being delayed from the preceding one by one n-th of the period of said divided clock signal.

12. The method of claim 10, wherein said selecting step includes:
    comparing the accumulated fractional portion with a set of possible ranges, and
    selecting said phase signal based upon the range to which said accumulated fractional portion corresponds.

13. The method of claim 10, wherein said clock signal includes n clock phases having the same frequency and delayed with respect to the preceding one by one n-th of the clock period, and
    wherein said phase signals are obtained from respective clock phases.

14. The method of claim 13, wherein one of said clock phases is divided by said integer portion incremented by said overflow to produce an initial phase signal; and
    wherein said generating step includes:
        applying said initial phase signal to a plurality of flip-flops,
        enabling said flip-flops based upon a corresponding one of said clock phases, and
        delaying the output of each of said flip-flops.

15. The method of claim 14, wherein said initial phase signal is serially applied to said flip-flops, and wherein said flip-flops are enabled in an interleaved manner.

16. The method of claim 15, wherein a flip-flop of rank i is enabled by the clock phase of rank $n+2-i$, and delayed $n-i-1$ clock cycles to provide the phase signal of rank $n-i$.

17. A method for providing a synthesized signal in response to digital control data comprising the steps of:
supplying a fast clock signal,
accumulating the least significant bits of the digital control data and outputting an overflow signal;
dividing the fast clock signal by the value of the most significant bits of the digital control data incremented by the overflow signal to produce an output clock signal:
generating n phase signals of the output clock signal each having increased delays; and
selecting one of said n phase signals based upon the accumulated least significant bits of the digital control data.

18. The method of claim 17, wherein said selecting step includes the steps of:
comparing the accumulated least significant bits of the digital control data with n ranges of possible values and outputting a corresponding rank; and
selecting, as the synthesized signal, the phase signal whose rank corresponds to the outputted rank.

19. The method of claim 17, wherein said fast clock signal includes n clock phases having the same frequency and Delayed with respect to the preceding one by one n-th of the clock period, and
wherein said phase signals are obtained from respective clock phases.

20. The method of claim 19, wherein one of said clock phases is divided in said dividing step; and
wherein said generating step includes:
applying said output clock signal to a plurality of flip-flops,
enabling said flip-flops based upon a corresponding one of said clock phases, and
delaying the output of each of said flip-flops.

* * * * *